United States Patent [19]
Dickes

[11] 4,449,059
[45] May 15, 1984

[54] TRIANGLE WAVEFORM GENERATOR HAVING A LOOP DELAY COMPENSATION NETWORK

[75] Inventor: E. Jon Dickes, Hillsboro, Oreg.

[73] Assignee: Tektronix, Inc., Beaverton, Oreg.

[21] Appl. No.: 282,477

[22] Filed: Jul. 13, 1981

[51] Int. Cl.³ .......................... H03K 4/08; H03K 4/80
[52] U.S. Cl. .................................... 307/228; 307/263; 328/181; 328/185
[58] Field of Search ..................... 328/181, 185, 114; 307/228, 263

[56] References Cited

U.S. PATENT DOCUMENTS

| 3,676,698 | 7/1972 | Hunter | 307/228 |
| 4,016,498 | 4/1977 | Hadley | 328/185 |
| 4,268,794 | 5/1981 | Handte et al. | 328/185 |

Primary Examiner—Stanley D. Miller
Assistant Examiner—B. P. Davis
Attorney, Agent, or Firm—George T. Noe

[57] ABSTRACT

A triangle waveform generator is provided with a compensation network to eliminate the effects of frequency and amplitude errors caused by switching-control loop delays of the system. This is achieved by causing early switching of an amplitude-limit sensing detector so that the generated triangle waveform reverses polarity at the correct level. The compensation network may be implemented to accommodate independent ramp rates.

7 Claims, 3 Drawing Figures

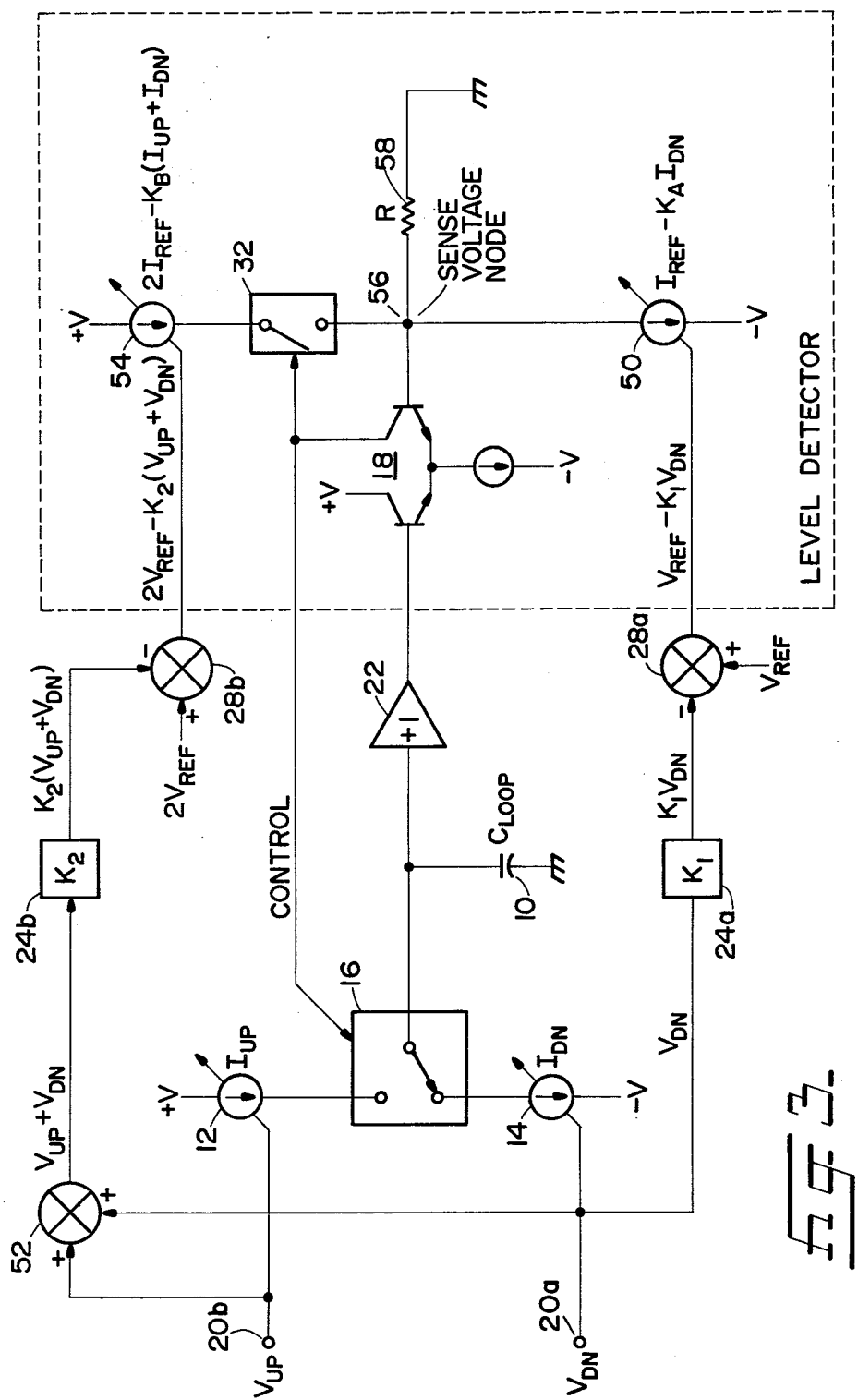

4,449,059

TRIANGLE WAVEFORM GENERATOR HAVING A LOOP DELAY COMPENSATION NETWORK

BACKGROUND OF THE INVENTION

This invention relates generally to a precision waveform signal source apparatus, and in particular to a triangle waveform generator having a network to compensate for current-switching control loop delays.

Conventional triangle waveform generators operate on the principle of charging and discharging a capacitor at constant rates to generate extremely linear up- and down-ramp voltages. Typically, triangle waveform generators include a current-switching control loop in which a comparator senses when the capacitor voltage has ramped to a predetermined limit and switches, reversing the direction of capacitor current so that the voltage begins to ramp in the other direction. However, there is a finite amount of delay time between the point at which the ramp voltage reaches the comparator reference level and the point at which the ramp voltage reverses direction because of the propagation times of the switching devices and the delay caused by the hysteresis effects of the comparator. The effect of this loop-delay behavior is the generation of triangles that become larger and larger as the frequency is increased.

The conventional solution to the foregoing problem has been to insert an RC peaking network into the loop between a buffer amplifier connected to the capacitor and the comparator input to boost the amplitude of the higher-frequency triangles, thereby causing an early switching of the comparator to compensate for the total loop delay. This is not a complete solution to the problem, however, because of the initial condition and charge rate of the compensation capacitor. That is, the conventional technique provides an approximate solution to the loop delay problem for free-running balanced-symmetry triangles, but not for triggered, gated, burst, or variable-symmetry operation.

SUMMARY OF THE INVENTION

In accordance with the present invention, a triangle waveform generator is provided with a network for compensating for current-switching control loop delays for all operating modes, including triggered, gated, burst, or variable-symmetry operation over a wide range of frequencies. A frequency control voltage is applied to voltage-controlled current generators to provide timing current for the timing capacitor in the conventional manner. The ramp voltage generated by the timing capacitor is directly coupled via a buffer amplifier to one input of a comparator which controls the switching of the timing current into and out of the timing capacitor. The frequency control voltage, which controls the ramp rate, and hence, frequency, is also applied to the delay compensation network to reduce the amplitude-sensing reference voltages of the comparator in accordance with a predetermined function to cause the comparator to switch early by an amount equal to the total time delay of the loop.

In a proposed commercial embodiment, separate ramp up and ramp down control signals are utilized to provide independent control of ramp-generating currents, and, consequently, triangle waveform slopes, and these signals are applied via separate compensation networks to the sense voltage node or reference input of the comparator.

It is therefore one object of the present invention to provide a triangle waveform generator having a novel current-switching loop delay compensation network.

It is another object of the present invention to compensate for current-switching loop delay errors in a triangle waveform generator by coupling the triangular voltages directly into a level-sensing comparator and independently reducing the sense voltages in response to commanded ramp up and ramp down rates.

It is a further object of the present invention to provide a triangle waveform generator with a network for compensating for current-switching control loop delays for many operating modes or combinations thereof, including triggered, gated, burst, continuous, or variable-symmetry operation over a wide range of frequencies.

Other objects and advantages of the present invention will become obvious to those having ordinary skill in the art upon a reading of the following description when taken in conjunction with the accompanying drawings.

DRAWINGS

FIG. 3 is a schematic of a triangle waveform generator having independently-controlled loop delay compensation networks for variable-symmetry operation.

DETAILED DESCRIPTION OF THE INVENTION

Figure 1:
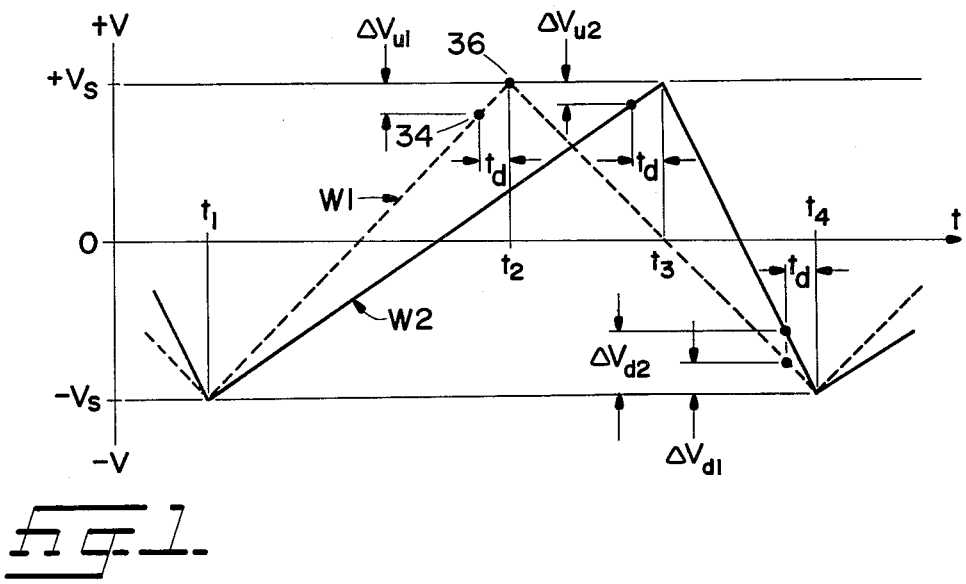
FIG. 1 is a waveform diagram to facilitate explanation of the present invention.

Referring to FIG. 1, there is shown a waveform diagram wherein the vertical axis represents voltage and the horizontal axis represents time. A waveform W1 and a waveform W2, shown as dashed lines and solid lines, respectively, are plotted between a time $t_1$ and a time $t_4$ to represent one cycle of repetitive triangle voltages which ideally rise linearly from a voltage $-V_s$ to a voltage $+V_s$, then reverse direction and fall linearly from $+V_s$ to $-V_s$. Waveform W1, having a balanced symmetry wherein time $t_2$ occurs exactly halfway between times $t_1$ and $t_4$ as the hardware allows and wherein the values of $+V_s$ and $-V_s$ are fixed, will be discussed in connection with the triangle waveform generator of FIG. 2. Waveform W2, having an unbalanced symmetry wherein time $t_3$ may be adjusted to any point between times $t_1$ and $t_4$ and wherein values of $+V_s$ and $-V_s$ may be independently controlled, will be discussed in connection with the triangle waveform generator of FIG. 3. Of course, the frequency may be adjusted in both the FIG. 2 and FIG. 3 embodiments.

Figure 2:
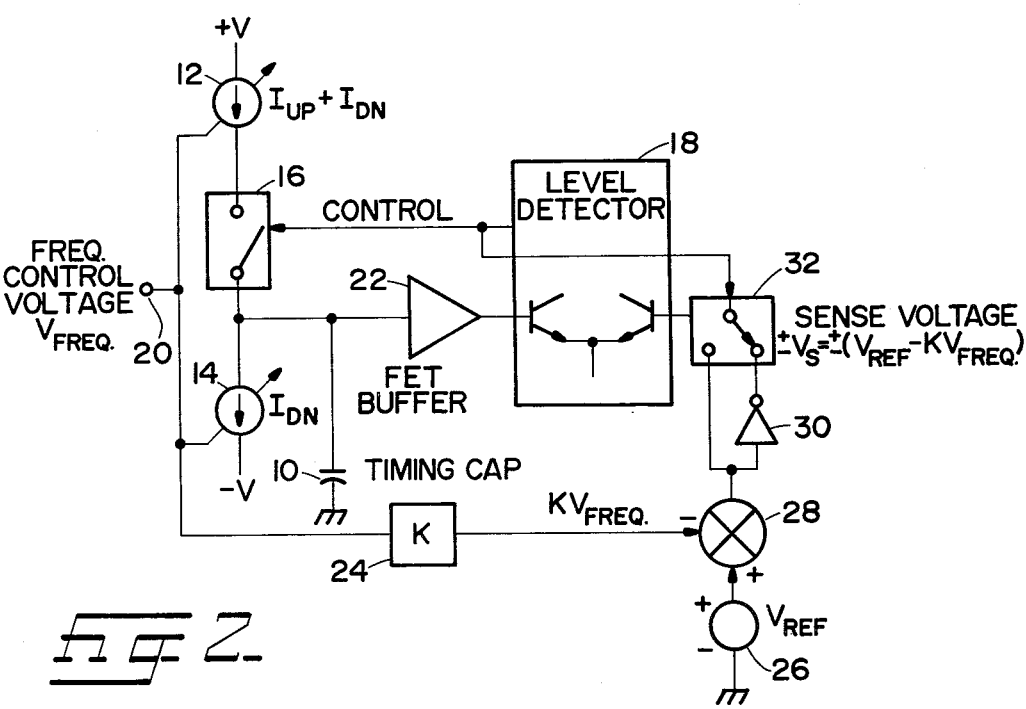
FIG. 2 is a schematic of a triangle waveform generator having a loop delay compensation network in accordance with the present invention.

In the triangle waveform generator of FIG. 2, there is shown a timing capacitor 10 having a bottom end connected to ground and a top end connected to the junction of a pair of voltage-controlled current generators 12 and 14, which are disposed in series between suitable power supply voltages $+V$ and $-V$. Also connected in series with current generator 12 and the top of capacitor 10 is a switch 16, which may be opened and closed upon command by a control signal from a level detector 18. A frequency control voltage $V_{FREQ}$ is applied via an input terminal 20 to both current generators 12 and 14 to set the levels of current therein. Of course, the level of current into and out of capacitor 10 determines the slopes of the ramp voltages generated thereby, and thus the voltage $V_{FREQ}$ controls the frequency of the triangle function signal. The level detector 18 may suitably include a comparator consisting of an emitter-coupled pair of transistors. The voltage across the timing capacitor 10 is applied via a buffer amplifier 22 to one input of the level detector 18. Buffer amplifier 22 may suitably include a field-effect transistor (FET) as its input device so that the voltage signal will operate the comparator while preventing current leakage therethrough.

Before discussing the amplitude-sense reference voltage which is applied to the other input of the level detector 18, it is important to note that a current-switching control loop is formed from the top of capacitor 10, through buffer amplifier 12, level detector 18, switch 16, and back to the top of capacitor 10. There is a finite time delay $t_d$ from the time at which the capacitor voltage reaches a limit until the switching occurs to thereby reverse the direction of current through the capacitor. This delay time is substantially constant for a given system, and therefore may be compensated by causing early switching of the comparator in level detector 18. For the FIG. 2 embodiment in which the symmetry is balanced and the voltage limits $+V_s$ and $-V_s$ are fixed, this is achieved by applying the frequency control voltage $V_{FREQ}$ to a compensation network 24 to produce a compensation voltage $KV_{FREQ}$, and then subtracting this compensation voltage from a reference voltage $V_{REF}$, produced by a voltage generator 26, in an algebraic summing device 28. The compensation network 24 suitably may be an attenuator or an amplifier, depending on the value of $V_{FREQ}$ and the desired compensation factor K. Referring to FIG. 1 again, note that for the dashed waveform W1, incremental voltages $\Delta V_{U1}$ and $\Delta V_{d1}$ are proportional to the time delay $t_d$ for the rising and falling portions of the waveform, respectively. These incremental voltages are actually instantaneous values of $KV_{FREQ}$ in the example shown, since it can be seen that if the frequency of the triangles is increased, the slopes of the waveform will become steeper, and the value of $KV_{FREQ}$, and hence the incremental voltages $\Delta V_U$ and $\Delta V_d$, will increase. In a like manner, the value of $KV_{FREQ}$ will decrease with a lowered frequency. The output of the algebraic summing device 28 is split into two paths, one of which is inverted by an inverting amplifier 30. A switch 32, which is controlled by the control line from the level detector 18, selects between positive and negative values if $V_{REF}-KV_{FREQ}$) to set the appropriate switching level of the comparator.

Reviewing the operation of the FIG. 2 embodiment in conjunction with FIG. 1, assume that at time $t_1$ the switch 16 is closed and the dashed waveform W1 rises linearly to a point 34 which is equal to $+(V_{REF}-KV_{FREQ})$ as capacitor 10 receives current $I_{UP}$, and the comparator within level detector 18 switches. At a point 36 corresponding to $t_2$ following the delay time $t_d$, the switch 16 has opened and the current $I_{DN}$ is pulled out of capacitor 10, causing the voltage change across the capacitor to reverse direction and begin downward precisely at the desired voltage $+V_s$. Meanwhile, switch 32 has switched over to receive $-(V_{REF}-KV_{FREQ})$ to set a new switching level for the comparator. The comparator switches again at $t_4-t_d$, and the voltage waveform reverses direction again at $t_4$, completing one cycle of waveform W1.

The embodiment of FIG. 3 utilizes the principles described above; however, in this embodiment the symmetry may be varied and the amplitude voltages $+V_s$ and $-V_s$ may be independently controlled to provide a very flexible triangle waveform function generator with the inherent time delay accurately compensated. Components which have the same or similar function to those of FIG. 2 have like or similar reference numerals to facilitate understanding of the FIG. 3 embodiment, and only the differences will be discussed.

First, separate and independently-controlled voltages $V_{DN}$ and $V_{UP}$ are applied via a pair of input terminals 20a and 20b, respectively, to control the currents $I_{DN}$ and $I_{UP}$ produced by voltage-controlled current generators 14 and 12, respectively. Switch 16 is implemented differently from that of FIG. 2; however, the function is still the same, and it is controlled by a control line from the level detector comparator 18. The voltage $V_{DN}$ is applied to a compensation network 24a to produce a compensation voltage $K_1V_{DN}$, which is subtracted from an independently-controlled reference voltage $V_{REF}$ in an algebraic summing device 28a. The resultant voltage $V_{REF}-K_1V_{DN}$ is utilized to control a voltage-controlled current generator 50, rather than being applied directly to the comparator 18 as a sense voltage.

The voltage $V_{DN}$ is also summed with the voltage $V_{UP}$ by an algebraic summing device 52, which sum is applied to a compensation network 24b to produce a compensation voltage $K_2(V_{UP}+V_{DN})$, which in turn is subtracted from an independently-controlled reference voltage $2V_{REF}$ in an algebraic summing device 28b. The resultant voltage $2V_{REF}-K_2(V_{UP}+V_{DN})$ is utilized to control a voltage-controlled current generator 54. A sense voltage for switching the comparator 18 is produced at a sense-voltage node 56 by forcing current through a resistor 58 having a value R connected from node 56 to ground. Switch 32 is implemented differently from that of FIG. 2; however, the function is essentially the same. With switch 32 closed, current from current generator 54 splits at node 56, with a fraction thereof (depending upon the symmetry) flowing to ground through resistor 58 and the remaining portion balancing that being conducted away from node 56 by current generator 50. Thus a positive sense voltage is produced at node 56. When switch 32 is open, current is pulled from ground through resistor 58 by current generator 50 to produce a negative sense voltage at node 56. In a proposed commercial embodiment of the FIG. 3 circuit, the values of $K_1$, $K_2$, R and $C_{LOOP}$ (the value of timing capacitor 10) are related as follows:

$$K_1=K_2=t_d/RC_{LOOP}.$$

While illustrative embodiments of my invention have been described in detail herein, it will become apparent to those skilled in the art that many changes and modifications may be made without departing from the invention in its broader aspects. For example, the current-switching bridge and actual current sources for triangle waveform generation may be implemented in a variety of ways known to skilled artisans. Similarly, the sensing node for the level detector may be implemented in a variety of ways, utilizing voltage-to-current translators and current-to-voltage translators as required. Accordingly, it is contemplated that the appended claims will be interpreted to cover any such modifications or embodiments as fall within the true scope of the invention.

What I claim as my invention is:

1. A triangle waveform generator, comprising:
   (a) means for generating positive-slope and negative-slope ramp waveforms;

(b) means for controlling the ramp rates of said waveform;

(c) means for establishing predetermined amplitude limits of said waveforms;

(d) means coupled to said ramp rate control means and said amplitude-limit establishment means for generating sense voltages which are within said amplitude limits by a predetermined time related factor, wherein said means for generating sense voltages comprises at least one compensation network having a predetermined multiplication constant coupled between said ramp-rate control means and said amplitude-limit establishment means;

(e) means for detecting when said ramp waveforms reach said sense voltages and for generating control signals in response thereto; and (f) means connected to said ramp waveform generating means and being responsive to said control signals for switching the polarity of slope of said ramp waveforms.

2. A triangle waveform generator in accordance with claim 1 wherein said ramp waveform generating means comprises a capacitive element and current generating means coupled thereto for selectively conducting current into and out of said capacitive element to generate ramp voltages thereby.

3. A triangle waveform generator in accordance with claim 2 wherein said current generating means comprises a pair of variable current generators.

4. A triangle waveform generator in accordance with claim 1 wherein said ramp waveform generating means comprises a capacitive element and a pair of variable current generators coupled thereto, and said ramp-rate control means comprises means for varying the levels of current in said current generators.

5. A triangle waveform generator in accordance with claim 4 wherein said variable current generators comprise voltage-to-current converters and said ramp-rate control means comprises means for applying independent control voltages to said voltage-to-current converters.

6. A triangle waveform generator in accordance with claim 1 wherein said detection means includes a comparator having a first input coupled to said ramp waveform generating means and a second input coupled to said sense voltage generating means.

7. A triangle waveform generator, comprising:

(a) means for generating positive-slope and negative-slope ramp waveforms;

(b) means for controlling the ramp rates of said waveforms;

(c) means for establishing predetermined amplitude limits of said waveforms, said amplitude-limit establishing means comprising means for generating independently controllable upper and lower amplitude limit reference voltages;

(d) means coupled to said ramp rate control means and said amplitude-limit establishment means for generating sense voltages which are within said amplitude limits by a predetermined time-related factor, said sense voltage generating means comprising a pair of networks for independently reducing said upper and lower amplitude sense limit voltages in accordance with the respective ramp rates of said positive-slope and negative-slope ramp waveforms;

(e) means for detecting when said ramp waveforms reach said sense voltages and for generating control signals in response thereto; and (f) means connected to said ramp waveform generating means and being responsive to said control signals for switching the polarity of slope of said waveforms.

* * * * *